United States Patent
Miyake et al.

(10) Patent No.: US 6,306,792 B1
(45) Date of Patent: *Oct. 23, 2001

(54) EVALUATING MOISTURE RESISTANCE RELIABILITY OF PHOSPHONIUM BORATE CATALYST

(75) Inventors: Sumiya Miyake, Yokohama; Akiko Okubo, Kawasaki; Hiromi Honda, Utsunomiya; Yoshiyuki Go, Kawasaki; Hiroshi Nagata, Yokohama; Minoru Kobayashi, Kawasaki, all of (JP)

(73) Assignee: Sumitomo Bakelite Company Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,812

(22) Filed: Dec. 1, 1998

(30) Foreign Application Priority Data

Dec. 3, 1997 (JP) .................................................. 9-332715
Apr. 28, 1998 (JP) ................................................ 10-119598

(51) Int. Cl.$^7$ .......................... B01J 31/20; B01J 31/22; C08G 59/68; C08K 63/04
(52) U.S. Cl. ..................... 502/155; 523/466; 523/468; 525/481; 528/89; 528/337
(58) Field of Search ............................. 502/155; 523/466, 523/468; 525/481; 528/89, 337

(56) References Cited

U.S. PATENT DOCUMENTS 4,414,079 * 11/1983 Yamataka et al. ...................... 204/75
5,221,761 6/1993 Jen et al. ............................... 558/268

FOREIGN PATENT DOCUMENTS

| 7-242683 | 9/1995 | (JP) . |
| 8-269167 | * 1/1996 | (JP) . |
| 8-196911 | * 8/1996 | (JP) . |
| 08-295721 | 11/1996 | (JP) . |
| 8-295721 | 11/1996 | (JP) . |
| 9-124768 | * 5/1997 | (JP) . |
| 9-124905 | * 5/1997 | (JP) . |
| 9-124906 | * 5/1997 | (JP) . |
| 9-176283 | * 7/1997 | (JP) . |
| 09-176283 | 7/1997 | (JP) . |
| 02-208669 | 8/1997 | (JP) . |
| 9-328535 | 12/1997 | (JP) . |
| 10-45873 | 2/1998 | (JP) . |
| 11-5829 | 1/1999 | (JP) . |

* cited by examiner

*Primary Examiner*—Robert E. L. Sellers
(74) *Attorney, Agent, or Firm*—Smith, Gambrell & Russell, LLP

(57) ABSTRACT

The moisture resistance reliability of a latent catalyst is evaluated for a phosphonium borate wherein at least one group pendant on the boron atom is a group formed when a proton donor having at least one proton capable of being liberated out of the molecule has liberated one or at least two protons, the evaluation comprising (1) mixing one gram of the proton donor wherefrom the latent catalyst is derived with 50 grams of purified water to obtain an aqueous mixture, (3) subjecting the aqueous mixture to pressure cooker treatment at a temperature of 125° C. for 20 hours in a pressure cooker vessel to obtain an extraction mixture, and (4) measuring the electrical conductivity of the extraction mixture wherein the acceptable electrical conductivity of the extraction mixture is no greater than 1,000 $\mu$S/cm.

9 Claims, No Drawings

EVALUATING MOISTURE RESISTANCE RELIABILITY OF PHOSPHONIUM BORATE CATALYST

BACKGROUND OF THE INVENTION

1. Field of the invention

This invention relates to a latent catalyst extremely excellent in moisture resistance reliability, curability and storage stability at ordinary temperature, a thermosetting resin composition comprising the same, an epoxy resin molding material for encapsulating a semi-conductor responding to insertion mounting and surface mounting which molding material comprises the above latent catalyst and is excellent in moisture resistance reliability, storage stability at ordinary temperature and moldability, and a semiconductor device in which the molding material is used.

2. Related Art Statement

Thermosetting resins have been required to have a storage stability at ordinary temperature for the purpose of simplifying the handling thereof, and various latent catalysts have been developed by now. The latent catalyst means a catalyst having excellent curability and excellent storage stability at ordinary temperature for exhibiting its catalytic activity at an appropriate temperature or higher. For example, JP-A-8-295,721 discloses that a tetra-substituted phosphonium tetra-substituted borate in which the substituents on boron have a specific structure has both excellent curability and excellent storage stability at ordinary temperature. The tetra-substituted phosphonium tetra-substituted borate exhibits its catalytic activity upon dissociation of the ionic bond between the anion portion and the cation portion, so that the temperature at which the catalytic activity is exhibited can be varied by changing the temperature at which the bond is dissociated. When the substituents on boron have a specific structure, the ionic bond comes to have an appropriate bond-strength and exhibits no activity at ordinary temperature but is dissociated at the curing temperature to rapidly exhibit activity. Therefore, excellent curability and excellent storage stability, namely latency, is developed. The field in which such a latent catalyst takes an important part includes an epoxy resin molding material for encapsulating a semiconductor such as IC, LSI or the like. As the catalyst which has heretofore been used, there are imidazoles, diazabicycloalkenes, triarylphosphines and the like; however, these catalysts act even at relatively low temperatures, so that molding materials in which these catalysts are used are inferior in storage stability at ordinary temperature. Therefore, when these molding materials are stored at ordinary temperature, such troubles arise that incomplete filling results from the lowering of flow property during molding, gold wire in IC chips is broken to cause conduction failure, and the like. Therefore, it has been essential to refrigerate the epoxy resin molding material for encapsulating a semiconductor (referred to hereinafter as the encapsulating material in some cases) when it is transported and stored. Moreover, recently, the performance required for IC as to the moisture resistance reliability has become strict more and more. For example, JP-A-7-242,683 mentions tetra-substituted phosphonium tetra-substituted borates in which phenoxy groups or the like are bonded to the phosphorus atom, namely P—O—C bonds are formed, and it discloses that the borates are effective as a catalyst enabling the encapsulating material to develop the storage stability at ordinary temperature; however, these tetra-substituted phosphonium tetra-substituted borates are easily hydrolyzed to produce phosphoric acid and there is a fear that the moisture resistance reliability may be remarkably deteriorated.

SUMMARY OF THE INVENTION

This invention provides a latent catalyst having extremely excellent moisture resistance reliability, curability and storage stability at ordinary temperature; a thermosetting resin composition comprising the same; an epoxy resin molding material for encapsulating a semiconductor responding to insertion mounting and surface mounting which molding material comprises the above latent catalyst and has excellent moisture resistance reliability, storage stability at ordinary temperature and moldability; and a semiconductor device in which the thermo-setting molding material is used.

The present inventors have diligently repeated research for solving the above-mentioned problems, and as a result of their examination of a relation between the moisture resistance reliability of the latent catalyst and the structure of a substituent bonded to the boron atom of the tetra-substituted phosphonium tetra-substituted borate described in JP-A-8-295,721 which is a patent application previously filed by the present inventors, they have found that a certain electric activity exhibited in water by a proton donor from which the substituent bonded to the boron atom results is closely connected with the moisture resistance reliability. That is to say, it has been clarified that when the electrical conductivity of the extraction water of the proton donor which is described in detail hereinafter is low, extremely excellent moisture resistance reliability is developed. Based on the above knowledge, this invention has been completed. That is to say, this invention provides the following:

(1) a latent catalyst composed of a phosphonium borate represented by the general formula (1) and a thermosetting resin composition comprising the catalyst:

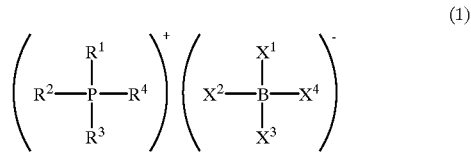

wherein $R^1$, $R^2$, $R^3$ and $R^4$ may be the same as or different from one another and each is a monovalent, organic group having an aromatic ring or a heterocyclic ring or a monovalent, aliphatic group and is bonded to the phosphorus atom to form a P—C bond; $X^1$, $X^2$, $X^3$ and $X^4$ may be the same as or different from one another and at least one of them is a group formed when a proton donor having at least one proton capable of being liberated out of the molecule has liberated one proton and each of the others is a monovalent, organic group having an aromatic ring or a heterocyclic ring or a monovalent, aliphatic group; and each of the above proton donors satisfies the condition that when 1 g of each proton donor is mixed with 50 g of purified water and the resulting mixture is subjected to pressure cooker treatment at 125° C. for 20 hours in a pressure cooker vessel, the electrical conductivity of the extraction water thus obtained becomes not more than 1,000 μS/cm, (2) a latent catalyst composed of a phosphonium borate represented by the general formula (2) and a thermosetting resin composition comprising the catalyst:

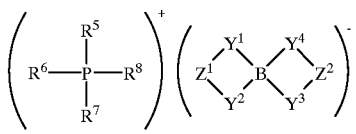

(2)

wherein $R^5$, $R^6$, $R^7$ and $R^8$ may be the same as or different from one another and each is a monovalent, organic group having an aromatic ring or a heterocyclic ring or a monovalent, aliphatic group and is bonded to the phosphorus atom to form a P—C bond; $Z^1$ is an organic group bonding to $Y^1$ and $Y^2$; $Z^2$ is an organic group bonding to $Y^3$ and $Y^4$; each of $Y^1$ and $Y^2$ is a group formed when a monovalent, proton-donating substituent has liberated a proton and the substituents $Y^1$ and $Y^2$ in the same molecule are bonded to the boron atom to form a chelate structure; each of $Y^3$ and $Y^4$ is a group formed when a monovalent, proton-donating substituent has liberated a proton and the substituents $Y^3$ and $Y^4$ are bonded to the boron atom to form a chelate structure; $Z^1$ and $Z^2$ may be the same as or different from each other and also $Y^1$ $Y^2$, $Y^3$ and $Y^4$ may be the same as or different from one another; and $HY^1Z^1Y^2H$ and $HY^3Z^2Y^4H$ which are proton donors before the ligands of boron $Y^1Z^1Y^2$ and $Y^3Z^2Y^4$ are formed by liberation of the respective protons satisfy the condition that when 1 g of each of the proton donors is mixed with 50 g of purified water and the resulting mixture is subjected to pressure cooker treatment at 125° C. for 20 hours in a pressure cooker vessel, the electrical conductivity of the extraction water thus obtained becomes not more than 1,000 $\mu$S/cm, (3) a latent catalyst composed of a phosphonium borate represented by the general formula (3) and a thermosetting resin composition comprising the catalyst:

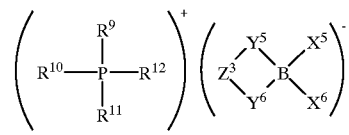

(3)

wherein $R^9$, $R^{10}$, $R^{11}$ and $R^{12}$ may be the same as or different from one another and each is a monovalent, organic group having an aromatic ring or a heterocyclic ring or a monovalent, aliphatic group and is bonded to the phosphorus atom to form a P—C bond; $Z^3$ is an organic group bonding to the substituents $Y^5$ and $Y^6$; $Y^5$ and $Y^6$ may be the same as or different from each other and each is a group formed when a monovalent proton-donating substituent has liberated a proton and the substituents $Y^5$ and $Y^6$ in the same molecule are bonded to the boron atom to form a chelate structure; $X^5$ and $X^6$ may be the same as or different from each other and each is a group formed when a proton donor having at least one proton capable of being liberated out of the molecule has liberated one proton, or a monovalent, organic group having an aromatic ring or a heterocyclic ring or a monovalent, aliphatic group; and $HY^5Z^3Y^6H$ which is a proton donor before the ligand of boron $Y^5Z^3Y^6$ is formed by liberation of the protons and $HX^5$ and $HX^6$ which are proton donors in the case where each of $X^5$ and $X^6$ is a group formed when a proton donor having at least one proton capable of being liberated out of the molecule has liberated one proton satisfy the condition that when 1 g of each of the proton donors is mixed with 50 g of purified water and the resulting mixture is subjected to pressure cooker treatment at 125° C. for 20 hours in a pressure cooker vessel, the electrical conductivity of the extraction water thus obtained becomes not more than 1,000 $\mu$S/cm, (4) a latent catalyst having a structure wherein a phosphonium borate consisting of a monovalent cation portion in which four groups are bonded to the phosphorus atom and a monovalent anion portion in which four groups are bonded to the boron atom is the recurring unit, at least two of which are connected through at least one of the four groups bonding to the boron atom (this type of latent catalyst is hereinafter referred to in some cases as the intermolecular reaction type latent catalyst) and a thermosetting resin composition comprising the above catalyst, provided that the group through which the recurring units are connected is a group formed when one proton donor has liberated at least two protons and the group may be composed of the same kind or different kinds; the groups bonding to the phosphorus atom may be the same as or different from one another and each thereof is a monovalent, organic group having an aromatic ring or a heterocyclic ring or a monovalent, aliphatic group and is bonded to the phosphorus atom to form a P—C bond; each of the groups which are bonded to the boron atoms but do not participate in the connection of the recurring units is a group formed when a proton donor having at least one proton capable of being liberated out of the molecule has liberated one proton, or a monovalent, organic group having an aromatic ring or a heterocyclic ring or a monovalent, aliphatic group and the above groups may be the same as or different from one another; and the proton donors from which the groups bonding to the boron atom result satisfy the condition that when 1 g of each of the proton donors is mixed with 50 g of purified water and the resulting mixture is subjected to pressure cooker treatment at 125° C. for 20 hours in a pressure cooker vessel, the electrical conductivity of the extraction water thus obtained becomes not more than 1,000 $\mu$S/cm, and (5) An epoxy resin molding material comprising as the essential components (A) an epoxy resin, (B) a phenolic resin, (C) at least one latent catalyst selected from the latent catalysts defined in the above items (1) to (4) and (D) an inorganic filler, wherein the equivalent ratio between the epoxy group of the total epoxy resin and the phenolic hydroxyl group of the total phenolic resin is 0.5 to 2 and the amount of the inorganic filler (D) compounded is 200 to 2,400 parts by weight per 100 parts by weight of a total amount of the total epoxy resin and the total phenolic resin; and a semiconductor device in which the epoxy resin molding material is used.

DETAILED DESCRIPTION OF THE INVENTION $R^1$, $R^2$, $R^3$ and $R^4$ in the general formula (1); $R^5$, $R^6$, $R^7$ and $R^8$ in the general formula (2); $R^9$, $R^{10}$, $R^{11}$ and $R^{12}$ in the general formula (3); and the groups bonding to the phosphorus atom in the intermolecular reaction type latent catalyst defined in the above item (4) may be the same as or different from one another and each thereof is a monovalent, organic group having an aromatic ring or a heterocyclic ring or a monovalent, aliphatic group and is bonded to the phosphorus atom to form a P—C bond. Such phosphonium groups include tetraphenylphosphonium group, tetratolylphosphonium group, tetraethylphenylphosphonium group, tetramethoxyphenylphosphonium group, tetranaphthylphosphonium group, tetrabenzylphosphonium group, ethyltriphenylphosphonium group, n-butyltriphenylphosphonium group, 2-hydroxyethyltriphenylphosphonium group, trimethylphenylphosphonium group, methyldiethylphenylphosphonium group, methyldiallylphenylphosphonium group, tetra-n-butylphosphonium group and the like; but are not limited thereto.

The proton donors from which the groups and ligands on boron result satisfy the condition that when 1 g of each of the proton donors is mixed with 50 g of purified water and the resulting mixture is subjected to pressure cooker treatment at 125° C. for 20 hours in a pressure cooker vessel, the electrical conductivity of the extraction water thus obtained becomes not more than 1,000 μs/cm. The groups and ligands on boron referred to above mean $X^1$, $X^2$, $X^3$ and $X^4$ in the general formula (1); $X^5$ and $X^6$ in the general formula (3); the groups which do not participate in the connection of the recurring units of the intermolecular reaction type phosphonium borate and which are formed when a proton donor has liberated one proton; $Y^1Z^1Y^2$ and $Y^3Z^2Y^4$ in the general formula (2); $Y^5Z^3Y^6$ in the general formula (3); and the groups participating in the connection of the recurring units of the intermolecular reaction type latent catalyst. In addition, each of the groups and ligands on boron has the structural characteristics as stated below.

At least one of $X^1$, $X^2$, $X^3$ and $X^4$ in the general formula (1) is a group formed when a proton donor having at least one proton capable of being liberated out of the molecule has liberated one proton and each of the others is a monovalent, organic group having an aromatic ring or a heterocyclic ring or a monovalent, aliphatic group, and they may be the same as or different from one another. Each of $X^5$ and $X^6$ in the general formula (3) and the groups not participating in the connection of the recurring units of the intermolecular reaction type latent catalyst is a group formed when a proton donor having at least one proton capable of being liberated out of the molecule has liberated one proton or a monovalent, organic group having an aromatic ring or a heterocyclic ring or a monovalent aliphatic group and they may be the same as or different from one another. Such proton donors from which $X^1$, $X^2$, $X^3$ and $X^4$ in the general formula (1), $X^5$ and $X^6$ in the general formula (3) and the groups not participating in the connection of the recurring units of the intermolecular reaction type phosphonium borate result satisfy the condition that the electrical conductivity of the extraction water as defined herein becomes not more than 1,000 μS/cm. They include organic acids such as carboxylic acids, phenolic compounds and the like; isocyanuric acids; and benzotriazoles and also include alcohols. Here, the phenolic compounds in this invention mean those in which at least one hydrogen bonded to the aromatic ring has been replaced with a hydroxyl group and include also hydroxyl group-substituted naphthalene and hydroxyl group-substituted other condensed polycyclic aromatics.

As the carboxylic acids, there are preferably mentioned aromatic carboxylic acids in which two carboxyl groups or a carboxyl group and a phenolic hydroxyl group are not present in the mutually adjacent positions, and examples thereof include benzoic acid, m-hydroxybenzoic acid, 1-naphthoic acid, 2,6-naphthalenedicarboxylic acid and the like. In this case, the aromatic carboxylic acids include also those having other substituents than carboxyl group such as m-hydroxybenzoic acid and the like. However, particularly preferable are substituted or unsubstituted benzoic acids and substituted or unsubstituted naphthoic acids. As the phenolic compounds, there are mentioned phenol, naphthol, p-phenylphenol, resorcin, 1,6-dihydroxynaphthalene, bisphenol A and the like. However, particularly preferable are substituted or unsubstituted phenols and substituted or unsubstituted naphthols. As the alcohols, there can be mentioned, for example, methanol, butanol, 2-propen-1-ol and the like. Moreover, diverse proton donors, for example, carboxylic acid and alcohol or phenol compound and isocyanuric acid, may be bonded to the same boron atom.

In the general formula (2), $Z^1$ is an organic group bonding to the substituents Y and $Y^2$. Each of $Y^1$ and $Y^2$ is a group formed when a monovalent proton-donating substituent has liberated a proton and the substituents $Y^1$ and $Y^2$ in the same molecule are bonded to the boron atom to form a chelate structure. $Z^2$ is an organic group bonding to the substituents $Y^3$ and $Y^4$. Each of $Y^3$ and $Y^4$ is a group formed when a monovalent, proton-donating substituent has liberated a proton and the substituents $Y^3$ and $Y^4$ in the same molecule are bonded to the boron atom to form a chelate structure. $Z^1$ and $Z^2$ may be the same as or different from each other and $Y^1$, $Y^2$, $Y^3$ and $Y^4$ may be the same as or different from one another. In the general formula (3), $Z^3$ is an organic group bonding to the substituents $Y^5$ and $Y^6$. Each of $Y^5$ and $Y^6$ is a group formed when a monovalent proton-donating substituent has liberated a proton, and the substituents $Y^5$ and $Y^6$ in the same molecule are bonded to the boron atom to form a chelate structure. The group through which the recurring units of the intermolecular reaction type latent catalyst are connected is a group formed when one proton donor has liberated two or more protons and the group may be composed of the same kind or different kinds.

Examples of the proton donors from which $Y^1Z^1Y^2$ and $Y^3Z^2Y^4$ in the general formula (2), $Y^5Z^3Y^6$ in the general formula (3) and the group through which the recurring units of the intermolecular reaction type latent catalyst are connected result, include organic acids such as carboxylic acids, phenolic compounds and the like and also include polyhydric alcohols and the like.

As such carboxylic acids and phenolic compounds, preferable are aromatic carboxylic acids and phenolic compounds which have at least two substituents selected from the group consisting of carboxyl group and phenolic hydroxyl group and in which two carboxyl groups or a carboxyl group and a phenolic hydroxyl group are not present in the mutually adjacent positions, and examples thereof include m-hydroxybenzoic acid, 3-hydroxy-1-naphthoic acid, isophthalic acid, 1,6-naphthalenedicarboxylic acid, catechol, resorcin, 2,3-dihydroxy-naphthalene, 2,2'-biphenol, bisphenol A, bisphenol S, 2,2'-methylene-bis(4-methylphenol) and the like. Among them, particularly preferable are dihydroxybenzene, dihydroxynaphthalene, bisphenols and biphenols. As the polyhydric alcohols, there can be mentioned 1,2-cyclohexanediol, 1,2-propanediol and the like. Furthermore, divergent proton donors, for example, a carboxylic acid and an alcohol, may be bonded to the same boron atom.

The intermolecular reaction type latent catalyst in the above item (4) is a polymolecular type phosphonium borate in which the number of moles of the phosphorus atom of the phosphonium group on the cationic side is equal to the number of moles of the boron atom of the borate on the anionic side.

The cationic side is composed of a phosphonium, each of the substituents of which is a monovalent, organic group having an aromatic ring or a heterocyclic ring or a monovalent, aliphatic group and in which the phosphorus atom and each substituent form a P—C bond, and every phosphonium group thereof forms an ionic pair with the boron anion (borate) on the anionic side. On the anionic side, at least one of the four groups on boron is bonded to at least one other boron through the conjugate base of a divalent or more multivalent proton donor, whereby a structure in which at least two recurring units which have been subjected to intermolecular reaction on the anionic side are connected, is formed. The number of the recurring units is not limited, and the conjugate bases of the divalent or more multivalent proton donors which have participated in the connection may be the same as or different from one another. Each of the groups on boron which do not participate in the connection of the recurring units is a group formed when a proton donor having at least one proton capable of being liberated out of the molecule has liberated one proton or a monovalent, organic group having an aromatic ring or a heterocyclic ring or a monovalent, aliphatic group, and they may be the same as or different from one another. The recurring unit means a pair of tetra-substituted phosphonium tetra-substituted borate.

The pressure cooker vessel used in this invention is a vessel having an internal volume of about 70 cc and having a double structure in which the inside is made of Teflon and the outside is of stainless steel, which vessel can maintain the content in the pressurized state in order to keep excellent closeness during the pressure cooker treatment and in which vessel substantially no impurity is dissolved out of the internal Teflon vessel during the pressure cooker treatment. The electrical conductivity of pure water used in this invention is not more than 5 $\mu$S/cm.

Moreover, the electrical conductivity of the extraction water in this invention is a value obtained by taking out the content of the pressure cooker vessel after the pressure cooker treatment at 125° C. for 20 hours, subjecting it to centrifugation and measuring the electrical conductivity of the extraction water thus obtained by a conductivity meter (Model ES-14 manufactured by HORIBA, LTD.).

The latent catalyst of this invention selected from the group consisting of the latent catalysts represented by the general formulas (1), (2) and (3) and the intermolecular reaction type latent catalyst defined in the above item (4) has a possibility of gradually generating a proton donor by contact of the group and ligand on boron with water when the moisture resistance reliability is evaluated. In addition, there is a fear that this proton donor adversely affects the resin-encapsulated electric and electronic parts when the moisture resistance reliability is evaluated. However, the present inventors have found that the proton donor which can be generated from the latent catalyst of this invention, that is, the proton donor satisfying the condition that the electrical conductivity of the extraction water obtained under the above-mentioned conditions is not more than 1,000 $\mu$S/cm, does not have such an adverse effect, and the latent catalyst of this invention is extremely excellent in moisture resistance reliability.

The detailed reason why the proton donor having the electrical conductivity of the extraction water not more than a specific value does not adversely affect the moisture resistance reliability as discussed above has not been clarified, but the electrical conductivity of the extraction water depends generally upon the solubility of the proton donor in water, the pKa of the proton donor and the mobility of the dissociated proton donor in water and reflects the behavior of the proton donor in the evaluation of the moisture resistance reliability. It can also be said that this value being large means that the proton donor tends to have some chemical action on the internal electric and electronic parts. The present inventors have examined the correlation between the electrical conductivity of the extraction water of the proton donor obtained under the above-mentioned conditions and the moisture resistance reliability to find that when the electrical conductivity of the extraction water is not more than 1,000 $\mu$S/cm, excellent moisture resistance reliability is developed and further to find a proton donor which develops a good moisture resistance reliability.

The total amount of the latent catalysts of this invention to be added to a thermosetting resin is 0.4 to 20 parts by weight per 100 parts by weight of the thermosetting resin. When the amount is less than 0.4 part by weight, it is too small to exert a sufficient catalytic effect, and when the amount exceeds 20 parts by weight, such inconveniences that the flow property is lowered and the like are caused in some cases.

The thermosetting resin to be contained in the thermosetting resin composition of this invention includes epoxy resins and maleimide resins, and also includes such resins that the reactive monomers are cyanates, isocyanates or acrylates; alkenyl resins; and alkynyl resins. In this invention, the term "thermosetting resin" should be interpreted to mean all resin systems whose thermal curing can be accelerated by use of the latent catalyst of this invention. Among them, the most preferable thermosetting resins are epoxy resins and maleimide resins; however, it is not objectionable to use the above-mentioned various thermosetting resins alone or in combination of two or more. Specific examples of the epoxy resins and maleimide resins are mentioned below.

As the epoxy resin in this invention, there can be mentioned bisphenol A type epoxy resins, bisphenol F type epoxy resins, brominated bisphenol type epoxy resins, biphenyl type epoxy resins, phenolic novolac type epoxy resins, cresol novolac type epoxy resins, alicyclic epoxy resins, glycidyl ester type epoxy resins, glycidylamine type epoxy resins, naphthalene type epoxy resins, glycidyl ether compounds of resins synthesized by condensation of naphthol or the like with a carbonyl compound, stilbene type epoxy resins, 4,4'-bis(1,2-epoxyethyl)diphenyl ether, 4,4'-bis(1,2-epoxyethyl)biphenyl, glycidyl ether compounds of phenolic resins obtained by reacting dicyclopentadiene with a phenol, and further, glycidyl ether compounds of monocyclic resorcin, catechol and the like; etc. These can be used alone or in combination of two or more.

In this invention, any curing agent which can react with the epoxy group to cause curing reaction can be used, if necessary. Specifically, as organic diamines and polyamines, there are mentioned straight chain aliphatic amines such as diethylenetriamine and triethylenetetramine; aliphatic amines such as N-aminoethylpiperazine and bis(4-aminocyclohexyl)methane; aromatic amines such as m-xylenediamine and diaminodiphenylmethane; dicyandiamide; guanidines; various polyamides; and modified polyamines. As examples of acid anhydrides, there are phthalic anhydride, trimellitic anhydride, tetrahydrophthalic anhydride and the like. Moreover, examples of phenols include phenolic resins and bisphenols which are co-condensation products of phenols with aldehydes or ketones; and phenolaralkyl resins which are co-condensation products of phenols with dimethoxy-p-xylene. Monocyclic resorcin, catechol and the like can be also used if they cause curing reaction. Since the definition of "phenol" is generally an aromatic compound in which the hydrogen atom bonded to the aromatic ring has been replaced by a hydroxyl group, the phenols include also co-condensation products of carbonyl compounds with hydroxyl group-containing compounds resulting from condensed polycyclic aromatics such as naphthol, and the like.

As the maleimide resins in this invention, there can be mentioned, for example, maleimides such as N,N'-m-phenylenebismaleimide, N,N'-m-toluylenebismaleimide, N,N'-4,4--biphenylenebismaleimide, N,N'-4,4'-[3,3'-dimethyl-biphenylene]bismaleimide, N,N'-4,4'-[3,3'-dimethyldiphenyl-methane]bismaleimide, N,N'-4,4'-diphenylmethanebismaleimide, N,N'-4,4'-diphenyletherbismaleimide, N,N'-4,4'-diphenylsulfonebismaleimide, 2,2-bis(4-(4-maleimidophenoxy)phenyl)propane, 2,2-bis(4-(4-maleimidophenoxy)phenyl)hexafluoropropane, 2,2-bis(4-(4-maleimidophenoxy)phenyl)sulfone and the like; products obtained by reacting these maleimides with amines by Michael addition; products obtained by addition reaction of the double bond of maleimides with the unsaturated bond of unsaturated group-containing compounds; and the like. These can be used alone or in combination of two or more. In addition, these can contain alkenylphenols, if necessary.

The thermosetting resin composition of this invention can, if necessary, contain inorganic fillers such as alumina, fused silica, crystalline silica, clay, talc and the like; various reinforcing agents such as glass cloth and the like; and additives such as releasing agents, flame retardants, coupling agents, coloring agents, antioxidants, surface active agents, conventionally known curing catalysts and the like.

In the epoxy resin molding material of this invention, the epoxy resin contained as the component (A) in addition to the latent catalyst of this invention which is the component (C), refers to all those monomers, oligomers and polymers which have at least two epoxy groups in one molecule. There are mentioned, for example, biphenyl type epoxy resins, bisphenol type epoxy resins, stilbene type epoxy resins, o-cresol novolac type epoxy resins, phenolic novolac type epoxy resins, triphenolmethane type epoxy resins, alkyl-modified triphenolmethane type epoxy resins, triazine nucleus-containing epoxy resins, dicyclopentadiene-modified phenol type epoxy resins and the like. These may be used alone or in admixture. Among these epoxy resins, preferable are crystalline epoxy resins having a melting point of 50–150° C. Such crystalline epoxy resins have a stiff structure such as biphenyl skeleton, bisphenol skeleton, stilbene skeleton or the like and have a relatively low molecular weight, and hence, show crystallizability. The crystalline epoxy resin is a solid which is crystallized at ordinary temperature, but rapidly melts in a temperature zone not lower than the melting point to be converted to a low viscosity liquid. The melting point of the crystalline epoxy resin means the temperature of the top of the endothermic peak of crystal fusion obtained by a differential scanning calorimeter when the temperature is elevated from ordinary temperature at a temperature-elevating rate of 5° C./min.

As the crystalline epoxy resin which satisfies the above conditions, particularly preferable is at least one member selected from the epoxy resins represented by the general formulas (4) and (5) or a mixture of a stilbene type epoxy resin represented by the general formula (6) with a stilbene type epoxy resin represented by the general formula (7).

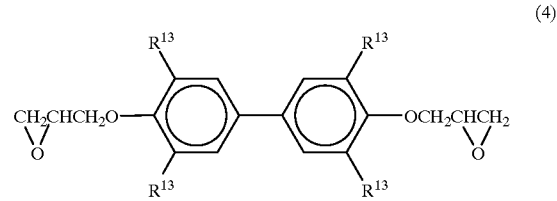

(4)

wherein each $R^{13}$ is an atom or a group selected from the group consisting of hydrogen atom, chain or cyclic alkyl groups having 1 to 6 carbon atoms, phenyl group and halogen atoms and the $R^{13}$ atoms or groups may be the same as or different from one another.

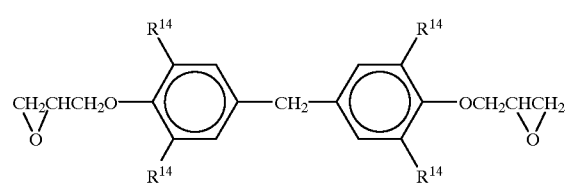

(5)

wherein each $R^{14}$ is a group or an atom selected from the group consisting of hydrogen atom, chain or cyclic alkyl groups having 1 to 6 carbon atoms, phenyl group and halogen atoms, and the $R^{14}$ groups or atoms may be the same as or different from one another.

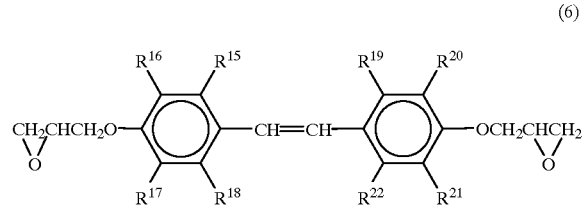

(6)

wherein each of $R^{15}$ to $R^{22}$ represents independently a group or an atom selected from the group consisting of hydrogen atom, chain or cyclic alkyl groups having 1 to 6 carbon atoms and halogen atoms, provided that the two aryl groups bonded to the carbon-carbon double bond are different from each other.

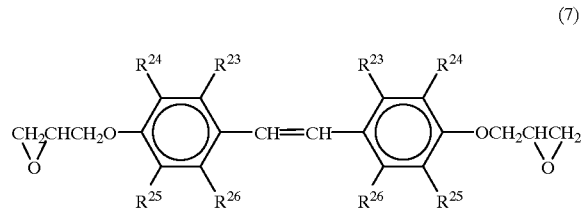

(7)

wherein each of $R^{23}$ to $R^{26}$ represents independently a group or an atom selected from the group consisting of hydrogen atom, chain or cyclic alkyl groups having 1 to 6 carbon atoms and halogen atoms, provided that the two aryl groups bonded to the carbon-carbon double bond are the same as each other.

As the substituents $R^{13}$ and $R^{14}$, there are mentioned, for example, methyl group, ethyl group, propyl group, butyl group, cyclohexyl group, phenyl group, chlorine atom, bromine atom and the like, and particularly preferable is methyl group.

As the substituents $R^{15}$ to $R^{26}$, there are mentioned, for example, hydrogen atom, methyl group, ethyl group, propyl group, butyl group, amyl group, hexyl group (including the respective isomers), cyclohexyl group, chlorine atom, bromine atom and the like, and particularly preferable are methyl group, ethyl group, propyl group and butyl group when it is taken into consideration that the melt viscosity of the epoxy resin is low.

With regard to a mixture of the stilbene type epoxy resin represented by the general formula (6) with the stilbene type epoxy resin represented by the general formula (7), both the stilbene type epoxy resins represented by the general formulas (6) and (7) include those having various structures depending upon the kind of substituent and the like, and each of the stilbene type epoxy resins represented by the general formulas (6) and (7) may be that having one kind structure or a mixture of those having different structures.

The mixing of the stilbene type epoxy resin represented by the general formula (6) with the stilbene type epoxy resin represented by the general formula (7) aims at lowering the melting point by mixing both the compounds and the mixing method is not limited. There are, for example, a method in which stilbene type phenols which are the starting materials of the stilbene type epoxy resins are previously mixed before the glycidyl etherification of them, a method in which both the stilbene type epoxy resins are mixed in the molten state, and the like. However, in any case, the melting point is adjusted to 50–150° C.

As the stilbene type epoxy resin represented by the general formula (6), particularly preferable are glycidyl etherification products of 5-tertiary butyl-4,4'-dihydroxy-2,3',5'-trimethylstilbene and 3-tertiary butyl-4,4,-dihydroxy-3',5,5,-trimethylstilbene from the viewpoint of easy availability, performance and starting material cost.

As the stilbene type epoxy resin represented by the general formula (7), particularly preferable are glycidyl etherification products of 4,4'-dihydroxy-3,31,5,51-tetramethylstilbene, 4,4'-dihydroxy-3,3'-ditertiary butyl-6,6'-dimethylstilbene, 4,41-dihydroxy-3,3,-ditertiary butyl-5,5'-dimethylstilbene from the viewpoint of performance and starting material cost.

The phenolic resin used as the component (B) of the epoxy resin molding material of this invention refers to all those monomers, oligomers and polymers which have at least two phenolic hydroxyl groups in one molecule, and includes, for example, phenolic novolacs, cresol novolacs, p-xylylene-modified phenolic resins, p-xylylene-m-xylylene-modified phenolic resins, terpene-modified phenolic resins, dicyclopentadiene-modified phenolic resins and the like. These may be used alone or in admixture. These phenolic resins can be used without being limited by molecular weight, softening point, hydroxyl group equivalent and the like.

Among these phenolic resins, particularly preferable are phenolaralkyl resins, because the water absorption of a molded article is small owing to little hydroxyl group in the molecule, the reactivity in the curing reaction is good owing to an appropriate mobility of the molecule and it is possible to make the viscosity low.

The equivalent ratio between the epoxy group of the total epoxy resin and the phenolic hydroxyl group of the total phenolic resin used in the epoxy resin molding material of this invention is 0.5 to 2, preferably 0.7 to 1.5. When the equivalent ratio is outside the range of 0.5 to 2, the curability, moisture resistance and the like are lowered, so that the equivalent ratios outside the above range are not desirable.

The kind of the inorganic filler used in the epoxy resin molding material of this invention is not limited, and there can be used those which are generally used in the encapsulating materials. There are mentioned, for example, fused crushed silica powder, fused spherical silica powder, crystalline silica powder, secondary agglomeration silica powder, alumina, titanium white, aluminum hydroxide, talc, clay, glass fiber and the like, and particularly preferable is fused spherical silica powder. The shape is preferably as close to true sphere as possible, and the amount of filler packed can be made large by mixing particles having different sizes.

The amount of the inorganic filler compounded is 200 to 2,400 parts by weight per 100 parts by weight of a total amount of the total epoxy resin and the total phenolic resin. When the amount is less than 200 parts by weight, there is a fear that the reinforcing effect of the inorganic filler may not be sufficiently developed, and when the amount exceeds 2,400 parts by weight, there is a fear that the flow property of the resin composition may be deteriorated and incomplete filling and the like may be caused during molding, so that the amounts outside the above range are not desirable. In particular, when the amount of the inorganic filler compounded is 250 to 1,400 parts by weight per 100 parts by weight of a total amount of the total epoxy resin and the total phenolic resin, the moisture absorption of the cured product of the resin composition becomes low, and the solder crack can be prevented from being caused, and further, the viscosity of the resin composition when melted becomes low, so that there is no fear that wire sweep can be caused in the interior of a semiconductor device. Therefore, said amount range is more preferable. Furthermore, it is preferable that the inorganic filler is previously mixed sufficiently. The epoxy resin molding material of this invention can be compounded with, if necessary, various additives, for example, coupling agents such as g-glycidoxypropyltrimethoxysilane and the like; coloring agents such as carbon black and the like; flame retardants such as brominated epoxy resins, antimony oxide, phosphorus compounds and the like; low stress components such as silicone oil, silicone rubber and the like; releasing agents such as natural wax, synthetic waxes, higher fatty acids, metal salts of higher fatty acids, paraffins and the like; antioxidants; etc., in addition to the components (A) to (D), and no troubles are caused even when the above additives are used in combination with other known catalysts such as triphenylphosphine, 1,8-diazabicyclo-(5,4,0)undecene-7, 2-methylimidazole and the like in such an amount that the characteristics of the latent catalyst of this invention are not deteriorated.

The epoxy resin molding material of this invention is obtained by mixing the components (A) to (D), the above-mentioned additives and the like at ordinary temperature using a mixer, kneading the resulting mixture in a kneader such as a roll, an extruder or the like, cooling the kneaded mixture and then pulverizing the same.

In order to encapsulate an electronic part such as a semiconductor or the like with the epoxy resin molding material of this invention to produce a semiconductor device, it is sufficient to cure and mold the molding material by a molding method such as transfer molding, compression molding, injection molding or the like.

DESCRIPTION OF PREFERRED EMBODIMENTS

Examples are shown below to explain this invention in more detail; however, this invention should not be construed to be limited to the Examples.

1. Examples relating to latent catalysts and t thermo-setting resin compositions comprising the catalysts Compounds 1 to 4 and 7 to 14

The structures of Compounds 1 to 4 and 7 to 14 used as catalysts (curing accelerators) in the Examples and Comparative Examples are shown below by chemical structural formulas.

Compound 1

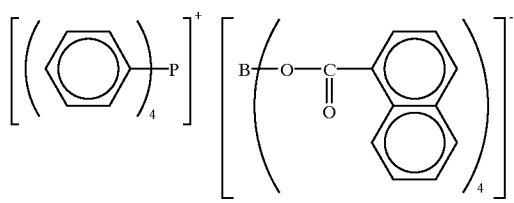

Compound 2

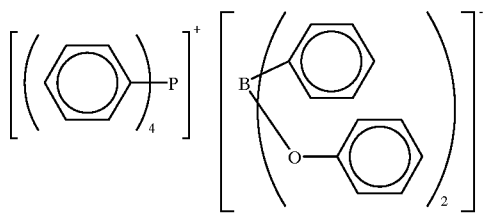

Compound 3

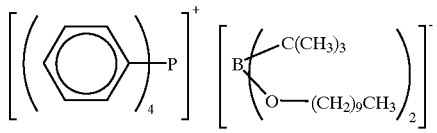

Compound 4

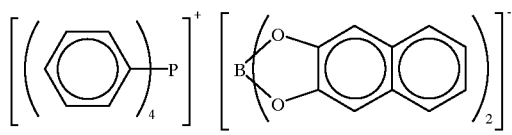

Compound 7

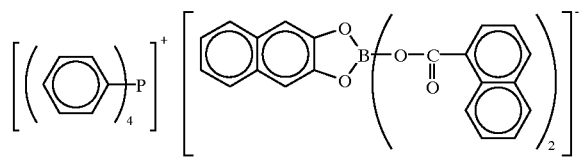

Compound 8

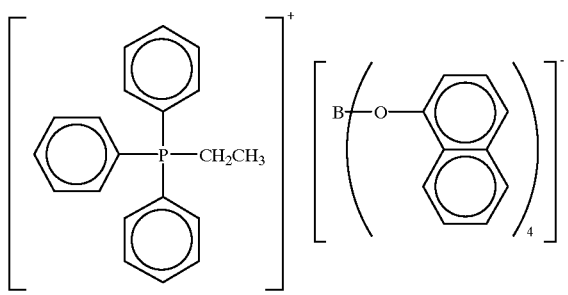

Compound 9

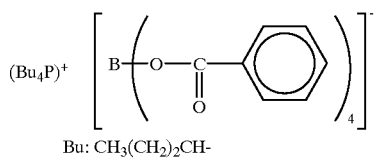

Bu: $CH_3(CH_2)_2CH-$

Compound 10

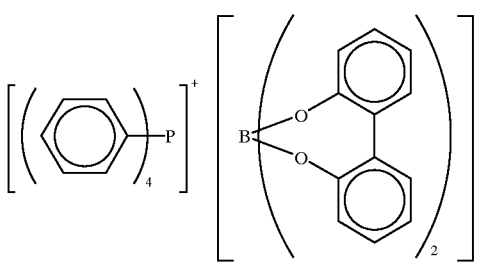

Compound 11

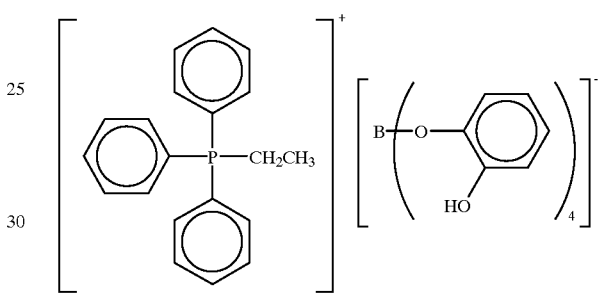

Compound 12

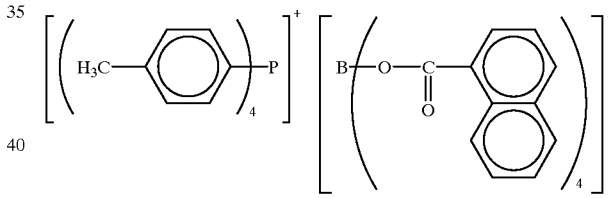

Compound 13

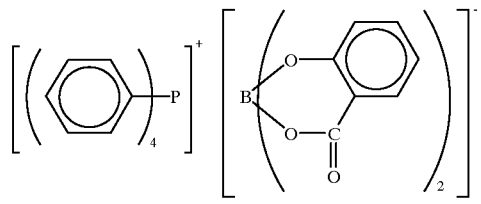

Compound 14

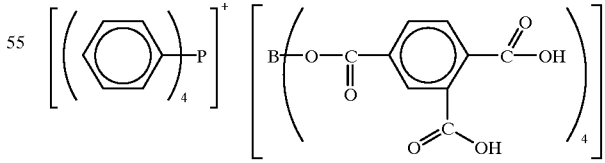

Compounds 5 and 6

Compounds 5 and 6 are intermolecular reaction type latent catalysts corresponding to the above item (4).

That is to say, they are polymolecular type phosphonium borates in which the number of moles of phosphorus atom of the phosphonium group on the cationic side is equal to the number of moles of boron atom of the borate on the anionic side.

a) Compound 5

The cationic side is a tetraphenylphosphonium group and each of the phosphonium groups forms an ionic pair with the boron anion on the anionic side. The anionic side has a recurring structure in which each of the four groups on boron is substituted by one of the two carboxylates of the conjugate base of isophthalic acid (isophthalate) and is further bonded to the boron atom of another molecule through the other carboxylate of the conjugate base of isophthalic acid. in this case, the recurring structure becomes a structure in which the boron atom is reacted with the isophthalate in a molar ratio of 1:2 on average.

b) Compound 6

The cationic side is a tetraphenylphosphonium group and each of the phosphonium groups forms an ionic pair with the boron anion on the anionic side. The anionic side has a recurring structure in which each of the four groups on boron is bonded to one of the two phenoxides of the conjugate base of bisphenol A and two other phenoxides on average are bonded to the boron of another molecule. In this case, the recurring structure becomes a structure in which the boron atom is reacted with the bisphenol A in a molar ratio of 1:3 on average.

The names of proton donors from which the groups and ligands on boron result and the electrical conductivities of the extraction water obtained by mixing 1 g of one of the proton donors with 50 g of purified water and then subjecting the resulting mixture to pressure cooker treatment at 125° C. for 20 hours in a pressure cooker vessel are collectively shown in Table 1. The proton donor corresponding to Compound 13 is an aromatic carboxylic acid having one carboxyl group in one molecule and one hydroxyl group in a position adjacent thereto, and the proton donor corresponding to Compound 14 is an aromatic carboxylic acid having two carboxyl groups in the mutually adjacent positions in the molecule.

(1) Evaluation with epoxy/(maleimide)/phenolic resin curing system

One of the various catalysts was incorporated into a thermosetting resin composition as shown in Table 2 and flow property, curability, storage stability and moisture resistance reliability were evaluated by the procedures stated below.

Specific evaluation methods are described below.

(i) Spiral Flow

Using a mold for measuring a spiral flow according to EMMI-I-66, measurement was effected at a mold temperature of 175° C. at an injection pressure of 70 kg/cm² for a curing time of 2 minutes. The spiral flow is a parameter of flow property and the larger the value, the better the fluidity.

(ii) Curing Torque

Using a curelastometer (JSR CURELASTOMETER Model IVPS manufactured by Orientech Co., Ltd.), the torque after 90 seconds at 175° C. was determined. The torque in the curelastometer is a parameter of curability and the larger the value, the better the curability.

(iii) Residual Flow Percentage

A sample was preserved at 25° C. for 30 days and thereafter subjected again to measurement of spiral flow, after which the percentage of the value obtained based on the initial spiral flow just after the preparation of the sample was determined by the following equation:

Residual flow percentage (%)=(spiral flow value after storage/initial spiral flow value)×100

The larger the residual flow percentage, the better the storage stability.

(iv) Moisture Resistance Reliability

A 16-pin-DIP was encapsulated with a resin composition obtained by mixing and kneading various components, and thereto was applied a voltage of 20 V in water vapor at 125° C. at a relative humidity of 100% for the predetermined period of time, after which conduction failure was checked. The time until the failure took place in a half of the packages evaluated was determined as a PCBT failure time. Incidentally, the evaluation time was 500 hours at longest and in the case where the number of failed packages at that time was less than half, the failure time was shown as "more than 500 hours". The longer this time, the better the moisture resistance reliability.

EXAMPLE 1

67 Parts by weight (hereinafter abbreviated to parts) of o-cresol novolac type epoxy (EOCN-1020-65 manufactured by NIPPON KAYAKU CO., LTD.), 33 parts of a phenolic novolac (PR-51470 manufactured by SUMITOMO DUREZ CO., LTD.), 4.3 parts of Compound 1 as a catalyst, 300 parts of fused silica and 2 parts of carnauba wax were mixed and then roll-milled at 90° C for 8 minutes to obtain a molding material. The spiral flow of this molding material was 70 cm and the curing torque thereof was 78 kgf·cm. The residual flow percentage after 30 days at 25° C. was 99%. Also, the PCBT failure time was more than 500 hours.

EXAMPLE 2

52 Parts of a biphenol type glycidyl ether epoxy (YX-4000H manufactured by Yuka Shell Epoxy Co., Ltd.), 48 parts of a p-xylene type phenolic resin (XL-225 manufactured by Mitsui Toatsu Chemicals, Inc.), 2.9 parts of Compound 2 as a catalyst, 800 parts of fused silica and 3 parts of carnauba wax were mixed and then roll-milled at 90° C. for 8 minutes to obtain a molding material. The spiral flow of this molding material was 90 cm and the curing torque thereof was 83 kgf·cm. The spiral flow residue after 30 days at 25° C. was 93%. Moreover, the PCBT failure time was more than 500 hours.

EXAMPLES 3 to 11 AND COMPARATIVE EXAMPLES 1 AND 2

According to the composition shown in Table 2, the components were mixed and a molding mixture was prepared and evaluated in the same manner as in Examples 1 and 2. The results obtained are collectively shown in Table 2, provided that in Examples 5 and 9, 70 parts of 2,2-bis(4-(4-maleimidophenoxy)phenyl)propane (Bismaleimide MB-8000 manufactured by Mitsubishi Yuka K. K.) was further mixed as a resin component in addition to EOCN-1020-65 and PR-51470 according to the composition shown in Table 2 and a molding material was prepared and evaluated in the same manner as in Example 1.

The PCBT failure time in each of Examples 1 to 11 was more than 500 hours. On the other hand, the PCBT failure time in each of Comparative Examples 1 and 2 was much shorter than 500 hours. From this fact, it is clear that the thermosetting resin compositions containing the latent catalyst of this invention exhibit extremely excellent moisture resistance reliability. Moreover, from the curing torques and residual flow percentages in Examples 1 to 11 and Comparative Examples 1 and 2, it is clear that the latent catalysts of this invention exhibit excellent curability and storage stability at ordinary temperature.

(2) Evaluation with epoxy/amine curing system

EXAMPLE 12

In 100 parts of a mixed solvent of N,N-dimethylformamide and methyl ethyl ketone (1:1) were dissolved 95 parts of a bisphenol A type epoxy resin (EP-1001 manufactured by Yuka Shell Epoxy K. K.), 4 parts of diaminodiphenylmethane, 1 part of dicyandiamide and 3.3 parts of Compound 1 to prepare a varnish. A 100-I$\mu$ glass cloth was impregnated with this varnish and then dried at 150° C. for 4 minutes to obtain a prepreg. Sixteen sheets of this prepreg were piled one on another and a copper foil having a thickness of 35$\mu$ was put on the outsides of the resulting assembly, after which the resulting assembly was sandwiched in between two sheets of a stainless steel plate and pressed at 40 kg/cm$^2$ at 170° C. for 50 minutes to obtain a double-copper-clad laminate having a thickness of 1.6 mm. The double-copper-clad laminate obtained was subjected, if necessary, to etching and then to measurement of glass transition temperature at a temperature-elevating rate of 5° C. /min in a dynamic viscoelasticity measuring apparatus. Furthermore, the evaluation of prepreg storage stability was conducted by removing the resin component from the prepreg, measuring the initial gel time (abbreviated to GT) at 170° C. and then the gel time after storage at 40° C. at 35% RH for 7 days, and calculating the residual GT percentage according to the following equation:

Residual GT percentage (%)=(GT (sec) after 7 days at 40° C. at 35% RH/initial GT (sec))×100.

The larger the residual gel time percentage, the better the storage stability.

EXAMPLES 13 TO 17 AND COMPARATIVE EXAMPLE 3

According to the composition shown in Table 3, the components were mixed and a sample was prepared and evaluated in the same manner as in Example 12. The results obtained are shown in Table 3.

(3) Evaluation with maleimide system

EXAMPLE 18

In 100 parts of a mixed solvent of chloroform and N,N-dimethylformamide (1:1) were dissolved 100 parts of 2,2-bis(4-(4-maleimidophenoxy)phenyl)propane (BMI-80 manufactured by Xeiai Kasei) and 3.1 parts of Compound 1 to prepare a varnish, and the varnish was rapidly vacuum-dried immediately after the preparation to remove the solvent, thereby obtaining a solid content. The initial gel time at 175° C. and the gel time after storage at 40° C. for 3 days of the solid content were measured and the residual gel time percentage was calculated by the following equation:

Residual gel time percentage (%)=(GT (sec) after 3 days at 40° C. /initial GT (sec))×100.

The larger the residual gel time percentage, the better the storage stability.

EXAMPLES 19 TO 23 AND COMPARATIVE EXAMPLE 4

According to the composition shown in Table 4, the components were mixed and a sample was prepared and evaluated in the same manner as in Example 18. The results obtained are shown in Table 4.

TABLE 1

| Catalyst | Type[1] | Corresponding proton donor | Electrical conductivity of extraction water of corresponding proton donor ($\mu$S/cm) |
|---|---|---|---|
| Compound 1 | A | Naphthoic acid | 121 |
| Compound 2 | A | Phenol | 27 |
| Compound 3 | A | n-Decanol | 5 |
| Compound 4 | B | 2,3-Dihydroxy-naphthalene | 33 |
| Compound 5 | D | Isophthalic acid | 184 |
| Compound 6 | D | Bisphenol A | 10 |
| Compound 7 | C | Naphthoic acid 2,3-Dihydroxy-naphthalene | 121 33 |
| Compound 8 | A | Naphthol | 11 |
| Compound 9 | A | Benzoic acid | 470 |
| Compound 10 | B | 2,2'-Biphenol | 19 |
| Compound 11 | A | Resorcin | 9 |
| Compound 12 | A | Naphthoic acid | 121 |
| Compound 13 | — | Salycylic acid | 1356 |
| Compound 14 | — | Trimellitic acid | 5904 |

Note: [1]
A: Type represented by general formula (1) defined in Claim 1.
B: Type represented by general formula (2) defined in Claim 2.
C: Type represented by general formula (3) defined in Claim 3.
D: Intermolecular reaction type defined in Claim 4.

TABLE 2

| | | Example 1 | Example 2 | Example 3 | Example 4 | Example 5 | Example 6 | Example 7 |
|---|---|---|---|---|---|---|---|---|
| | Catalyst species | Compound 1 | Compound 2 | Compound 3 | Compound 4 | Compound 5 | Compound 6 | Compound 8 |
| | Proton donor species | Naphthoic acid | Phenol | n-Decanol | 2,3-Dihydroxy-naphthalene | Isophthalic acid | Bisphenol A | Naphthol |
| Composition (part by weight) | Catalyst (Curing accelerator) | 4.3 | 2.9 | 3.2 | 3.3 | 2.8 | 4 | 4.1 |
| | EOCN-1020-65 | 67 | — | 67 | — | 20 | — | 67 |
| | PR-51470 | 33 | — | 33 | — | 10 | — | 33 |

TABLE 2-continued

|  |  |  |  |  |  |  |  |  |
|---|---|---|---|---|---|---|---|---|
|  | YX4000H | — | 52 | — | 52 | — | 52 | — |
|  | XL-225 | — | 48 | — | 48 | — | 48 | — |
|  | MB-8000 | — | — | — | — | 70 | — | — |
|  | Fused silica | 300 | 800 | 300 | 800 | 300 | 800 | 300 |
|  | Carnauba wax | 2 | 3 | 2 | 3 | 2 | 3 | 2 |
| Curing torque (kgf · cm) |  | 78 | 83 | 75 | 86 | 90 | 77 | 81 |
| Spiral flow (cm) |  | 70 | 90 | 72 | 100 | 81 | 94 | 75 |
| Residual flow percentage (%) |  | 99 | 93 | 89 | 90 | 96 | 90 | 96 |
| Moisture resistance reliability evaluation |  | >500 | >500 | >500 | >500 | >500 | >500 | >500 |

|  |  | Example 8 | Example 9 | Example 10 | Example 11 | Comp. Ex. 1 | Comp. Ex. 2 |
|---|---|---|---|---|---|---|---|
|  | Catalyst species | Compound 9 | Compound 10 | Compound 11 | Compound 12 | Compound 13 | Compound 14 |
|  | Proton donor species | Benzoic acid | 2,2'-Biphenol | Resorcin | Naphthoic acid | Salicylic acid | Trimellitic acid |
| Composition (part by weight) | Catalyst (Curing accelerator) | 3.1 | 3.5 | 3 | 3.8 | 3 | 4.9 |
|  | EOCN-1020-65 | — | 20 | — | 67 | 67 | — |
|  | PR-51470 | — | 10 | — | 33 | 33 | — |
|  | YX4000H | 52 | — | 52 | — | — | 52 |
|  | XL-225 | 48 | — | 48 | — | — | 48 |
|  | MB-8000 | — | 70 | — | — | — | — |
|  | Fused silica | 800 | 300 | 800 | 300 | 300 | 800 |
|  | Carnauba wax | 3 | 2 | 3 | 2 | 2 | 3 |
| Curing torque (kgf · cm) |  | 88 | 79 | 83 | 84 | 90 | 90 |
| Spiral flow (cm) |  | 82 | 76 | 91 | 78 | 99 | 83 |
| Residual flow percentage (%) |  | 91 | 88 | 87 | 99 | 88 | 90 |
| Moisture resistance reliability evaluation |  | >500 | >500 | >500 | >500 | 300 | 250 |

TABLE 3

|  |  | Example 12 | Example 13 | Example 14 | Example 15 | Example 16 | Example 17 | Comp. Ex. 3 |
|---|---|---|---|---|---|---|---|---|
|  | Catalyst species | Compound 1 | Compound 8 | Compound 9 | Compound 4 | Compound 11 | Compound 6 | 2-Phenyl-4-methyl-imidazole |
|  | Proton donor species | Naphthoic acid | Naphthol | Benzoic acid | 2,3-Dihydroxy-naphthalene | Resorcin | Bisphenol A | — |
| Composition (part by weight) | Catalyst (Curing accelerator) | 3.3 | 3.1 | 2.8 | 3.3 | 3 | 3.4 | 0.05 |
|  | Bisphenol A type epoxy resin | 95 | 95 | 95 | 95 | 95 | 95 | 95 |
|  | Diaminodiphenylmethane | 4 | 4 | 4 | 4 | 4 | 4 | 4 |
|  | Dicyandiamide | 1 | 1 | 1 | 1 | 1 | 1 | 1 |
| Glass transition temperature (° C.) |  | 148 | 145 | 141 | 144 | 140 | 150 | 102 |
| Initial gel time (sec) |  | 241 | 249 | 253 | 244 | 251 | 239 | 166 |
| Gel time after storage treatment (sec) |  | 239 | 242 | 243 | 239 | 248 | 232 | 101 |
| Residual gel time percentage (%) |  | 99 | 97 | 96 | 98 | 99 | 97 | 61 |

TABLE 4

|  |  | Example 18 | Example 19 | Example 20 | Example 21 | Example 22 | Example 23 | Comp. Ex. 4 |
|---|---|---|---|---|---|---|---|---|
|  | Catalyst species | Compound 1 | Compound 2 | Compound 8 | Compound 4 | Compound 10 | Compound 12 | 2-Phenyl-4-methyl-imidazole |
|  | Proton donor species | Naphthoic acid | Phenol | Naphthol | 2,3-Dihydroxy-naphthalene | 2,2'-Biphenol | Naphthoic acid | — |
| Composition (part by weight) | Catalyst (curing accelerator) | 3.1 | 2.9 | 3 | 3.4 | 3.2 | 3.3 | 0.6 |
|  | BMI-80 | 100 | 100 | 100 | 100 | 100 | 100 | 100 |

TABLE 4-continued

| | Example 18 | Example 19 | Example 20 | Example 21 | Example 22 | Example 23 | Comp. Ex. 4 |
|---|---|---|---|---|---|---|---|
| Residual gel time percentage (%) | 99 | 98 | 99 | 99 | 96 | 97 | 77 |

2. Examples relating to epoxy resin molding material and semiconductor device

EXAMPLE 24

51 Parts of a resin comprising as the main component a biphenyl type epoxy resin represented by the formula (8) (epoxy equivalent: 185, melting point: 105° C.):

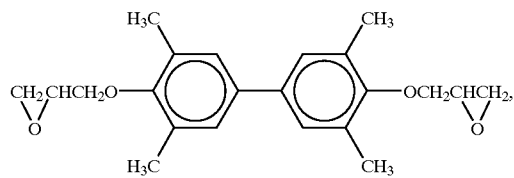

49 parts of a phenolic resin represented by the formula (9) (hydroxyl group equivalent: 167, softening point: 73° C.):

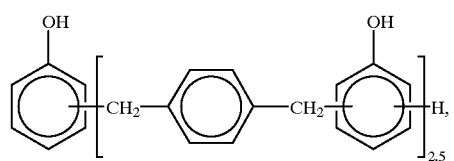

6.0 parts of Compound 1, 500 parts of fused spherical silica (average particle size: 15 μm), 2 parts of carbon black, 2 parts of a brominated bisphenol A type epoxy resin and 2 parts of carnauba wax were mixed and roll-milled at 95° C. for 8 minutes using a hot roll, and thereafter, the resulting mixture was cooled and then pulverized to obtain a resin molding material. The resin molding material obtained was evaluated by the methods described below to obtain the results shown in Table 5.

Evaluation Methods (i') Spiral Flow

Using a mold for spiral flow measurement according to EMMI-I-66, measurement was conducted at a mold temperature of 175° C. at an injection pressure of 70 kg/cm² for a curing time of 2 minutes. The spiral flow is a parameter of flow property and the larger the value, the better the flow property. The unit is cm.

(ii') Shore D Hardness

Molding was conducted at a mold temperature of 175° C. at an injection pressure of 70 kg/cm² for a curing time of 2 minutes and Shore D hardness was measured after 10 seconds from the opening of the mold. The value thus obtained was evaluated as a curability. The Shore D hardness is an index of curability and the larger the value, the better the curability.

(iii') Storage Stability at 30° C.

After the storage at 30° C. for one week, the spiral flow was measured, and the percentage thereof based on the spiral flow just after the preparation of the sample was calculated. The unit is %.

(iv') Moisture Resistance Reliability

A 16-pin-DIP was encapsulated with a resin molding material at a mold temperature of 175° C. at a pressure of 70 kg/cm² for a curing time of 2 minutes and then post-cured at 175° C. for 8 hours. Thereto was applied a voltage of 20 V in water vapor at 125° C. at a relative humidity of 100%, after which conduction failure was examined. The time until the failure took place in at least 8 of 15 packages evaluated was determined as a failure time. The unit is hour. Incidentally, the measurement time was 500 hours at longest and in the case where the number of failed packages at that time was less than 8, the failure time was shown as "more than 500 hours". The longer the failure time, the better the moisture resistance reliability.

EXAMPLES 25 TO 31 AND COMPARATIVE EXAMPLES 5 to 7

According to the formulations shown in Tables 5 and 6, resin molding materials were prepared and evaluated in the same manner as in Example 24. The results obtained are shown in Tables 5 and 6.

Incidentally, the crystalline epoxy resin A used in Example 25 was a mixture of 60% by weight of a resin comprising as the main component 4,4'-bis(2,3-epoxypropoxy)-3131,5,51-tetramethylstilbene with 40% by weight of a resin comprising as the main component 4,4'-bis(2t3-epoxypropoxy)-5-tertiary butyl-2,31,5'-trimethyl-stilbene (epoxy equivalent: 209, melting point: 120° C. ).

The o-cresol novolac type epoxy resin used in Example 26 had an epoxy equivalent of 200 and a softening point of 65° C. (EOCN-1020-65 manufactured by NIPPON KAY-AKU CO., LTD.).

The phenolic novolac resin used in Example 26 had a hydroxyl group equivalent of 104 and a softening point of 105° C.

When triphenylphosphine was used as the catalyst (curing accelerator), the failure time in the moisture resistance reliability was good; however the storage stability at 30° C. was lowered (cf. Comparative Example 5).

When Compound 13 and Compound 14, the proton donors corresponding to which had an electrical conductivity of the extraction water of more than 1,000 μs/cm, were used as the curing accelerator, the moisture resistance reliability was lowered (cf. Comparative Examples 6 and 7).

TABLE 5

|  | Example 24 | Example 25 | Example 26 | Example 27 | Example 28 | Example 29 | Example 30 | Example 31 |
|---|---|---|---|---|---|---|---|---|
| Formula (8) | 51 |  |  | 51 | 51 | 51 | 51 | 51 |
| Crystalline epoxy resin A |  | 56 |  |  |  |  |  |  |
| o-Cresol novolac type epoxy resin |  |  | 67 |  |  |  |  |  |
| Formula (9) | 49 | 44 |  | 49 | 49 | 49 | 49 | 49 |
| Phenol novolac resin |  |  | 33 |  |  |  |  |  |
| Compound 1 | 6.0 | 6.0 | 4.3 |  |  |  |  |  |
| Compound 2 |  |  |  | 2.9 |  |  |  |  |
| Compound 3 |  |  |  |  | 4.5 |  |  |  |
| Compound 4 |  |  |  |  |  | 3.3 |  |  |
| Compound 5 |  |  |  |  |  |  | 4.0 |  |
| Compound 7 |  |  |  |  |  |  |  | 4.7 |
| Fused spherical silica | 500 | 500 | 400 | 500 | 500 | 500 | 500 | 500 |
| Carbon black | 2 | 2 | 2 | 2 | 2 | 2 | 2 | 2 |
| Brominated bisphenol A type epoxy resin | 2 | 2 | 2 | 2 | 2 | 2 | 2 | 2 |
| Carnauba wax | 2 | 2 | 2 | 2 | 2 | 2 | 2 | 2 |
| Spiral flow | 98 | 92 | 120 | 102 | 95 | 100 | 97 | 101 |
| Shore D hardness | 85 | 88 | 83 | 83 | 83 | 80 | 81 | 82 |
| Storage stability at 30° C. | 95 | 98 | 98 | 96 | 95 | 95 | 93 | 97 |
| Moisture resistance reliability | >500 | >500 | >500 | >500 | >500 | >500 | >500 | >500 |

TABLE 6

|  | Comp. Ex. 5 | Comp. Ex. 6 | Comp. Ex. 7 |
|---|---|---|---|
| Formula (8) | 51 | 51 | 51 |
| Formula (9) | 49 | 49 | 49 |
| Triphenylphosphine | 1.0 |  |  |
| Compound 13 |  | 2.1 |  |
| Compound 14 |  |  | 4.9 |
| Fused spherical silica | 500 | 500 | 500 |
| Carbon black | 2 | 2 | 2 |
| Brominated bisphenol A type epoxy resin | 2 | 2 | 2 |
| Carnauba wax | 2 | 2 | 2 |
| Spiral flow | 77 | 100 | 95 |
| Shore D hardness | 88 | 82 | 86 |
| Storage stability at 30° C. | 52 | 88 | 87 |
| Moisture resistance reliability | >500 | 200 | 250 |

As clear from the above Examples, the latent catalyst of this invention and the thermosetting resin composition of this invention comprising the above catalyst are excellent in moisture resistance reliability, curability and storage stability at ordinary temperature. Moreover, the epoxy resin molding material of this invention comprising the above catalyst for encapsulating a semiconductor is extremely excellent in characteristics of preservation at ordinary temperature and moldability, and the semiconductor device in which the epoxy resin molding material is used, is excellent in moisture resistance reliability and useful as a device responding to insertion mounting and surface mounting.

What is claimed is:

1. A method of evaluating the moisture resistance reliability of a latent catalyst to determine whether the latent catalyst is suitable for thermosetting resin compositions, the method comprising:

(1) providing a latent catalyst, derived from at least one proton donor, which latent catalyst corresponds to a member selected from the group consisting of:

(a) the general formula (I):

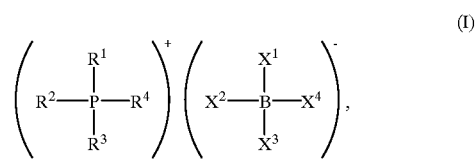

wherein $R^1$, $R^2$, $R^3$ and $R^4$ may be the same as or different from one another and each is a monovalent organic group having an aromatic ring or a heterocyclic ring or a monovalent aliphatic group, and is bonded to the phosphorus atom to form a P—C bond, and wherein $X^1$, $X^2$, $X^3$ and $X^4$ may be the same as or different from one another, and at least one of which is a group formed when a proton donor having at least one proton capable of being liberated out of the molecule has liberated one proton, and each of the others is a monovalent organic group having an aromatic ring or a heterocyclic ring or a monovalent aliphatic group;

(b) the general formula (II):

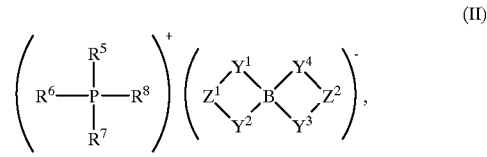

wherein $R^5$, $R^6$, $R^7$ and $R^8$ may be the same as or different from one another and each is a monovalent organic group having an aromatic ring or a heterocyclic ring or a mono-valent aliphatic group, and is bonded to the phosphorus atom to form a P—C bond, $Z^1$ is an organic group bonding to $Y^1$ and $Y^2$, and $Z^2$ is an organic group bonding to $Y^3$ and $Y^4$, each of $Y^1$ and $Y^2$ is a group formed when a monovalent, proton-donor has liberated a proton, and the substituents $Y^1$ and $Y^2$ in the same molecule are bonded to the boron atom to form a chelate structure, each of $Y^3$ and $Y^4$ is a group formed when a monovalent, proton-donor has liberated a proton, and the substituents $Y^3$ and $Y^4$ are bonded to the boron atom to form a chelate structure, $Z^1$ and $Z^2$ are the same as or different from each other, and $Y^1$ and $Y^2$, and $Y^3$ and $Y^4$ may be the same as or different from one another, and wherein the formulas $H\,Y^1\,Z^1\,Y^2\,H$ and $H\,Y^3\,Z^2\,Y^4H$ correspond to proton donors before the ligands $Y^1\,Z^1\,Y^2$ and $Y^3\,Z^2\,Y^4$ of boron are formed by liberation of the respective protons;

(c) the general formula (III):

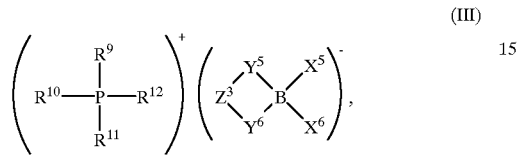

wherein $R^9$, $R^{10}$, $R^{11}$ and $R^{12}$ may be the same as or different from one another, and each is a monovalent organic group having an aromatic ring or a heterocyclic ring or a monovalent aliphatic group, and is bonded to the phosphorus atom to form a P—C bond, $Z^3$ is an organic group bonding to the substituents $Y^5$ and $Y^6$, $Y^5$ and $Y^6$ may be the same as or different from each other, and each is a group formed when a monovalent proton-donor has liberated a proton, and the substituents $Y^5$ and $Y^6$ in the same molecule are bonded to the boron atom to form a chelate structure, and $X^5$ and $X^6$ may be the same as or different from each other, and each is a group formed when a proton donor having at least one proton capable of being liberated out of the molecule has liberated one proton, or is a monovalent organic group having an aromatic ring or a heterocyclic ring or a monovalent aliphatic group, and wherein the formula $H\,Y^5\,Z^3\,Y^6\,H$ corresponds to a proton donor before the ligand $Y^5\,Z^3\,Y^6$ of boron is formed by the liberation of the protons, and wherein $HX^5$ and $HX^6$ are proton donors in the case where each of $X^5$ and $X^6$ is a group formed when a proton donor having at least one proton capable of being liberated out of the molecule has liberated one proton; and (d) a compound having a structure of recurring units in which the recurring unit is a phosphonium borate consisting of a monovalent cation portion in which four groups are bonded to the phosphorus atom and a monovalent anion portion in which four groups are bonded to the boron atom, wherein at least two of the recurring units are connected through at least one of the four groups bonding to the boron atom, and wherein the group through which the recurring units are connected is a group formed when a proton donor has liberated at least two protons, wherein the groups bonding to the phosphorus atom may be the same as or different from one another, and each is a monovalent, organic group having an aromatic ring or a heterocyclic ring or a monovalent aliphatic group, and is bonded to the phosphorus atom to form a P—C bond; and wherein, among the groups bonding to the boron atom, those which do not participate in the connection of the recurring units are each a group formed when a proton donor having at least one proton capable of being liberated out of the molecule has liberated one proton, or a monovalent organic group having an aromatic ring, or a heterocyclic ring or a monovalent aliphatic group, which groups may be the same as or different from one another;

(2) mixing 1 gram of the proton donor from which the latent catalyst is derived with 50 grams of purified water to obtain an aqueous mixture;

(3) subjecting the aqueous mixture to pressure cooker treatment at a temperature of 125° C. for 20 hours in a pressure cooker vessel to obtain an extraction mixture; and (4) measuring the electrical conductivity of the extraction mixture to determine whether the electrical conductivity of the extraction mixture is greater than 1,000 $\mu$S/cm, wherein the electrical conductivity of an extraction mixture obtained from a proton donor of a catalyst suitable for thermosetting resin compositions is no greater than 1,000 $\mu$S/cm.

2. The method according to claim 1, wherein the proton donor is an aromatic carboxylic acid or a phenolic compound.

3. The method according to claim 1, wherein the proton donor is an aromatic carboxylic acid or phenolic compound having at least one substituent selected from the group consisting of carboxyl group and phenolic hydroxyl group, and in which two carboxyl groups or a carboxyl group and a phenolic hydroxyl group are not present at mutually adjacent positions.

4. The method according to claim 1, wherein the latent catalyst corresponds to formula I, and wherein the proton donor having at least one proton capable of being liberated out of the molecule is a proton donor selected from the group consisting of substituted or unsubstituted benzoic acids, substituted or unsubstituted naphthoic acids, substituted or unsubstituted phenols and substituted or unsubstituted naphthols.

5. The method according to claim 1, wherein the latent catalyst corresponds to formula III, and wherein the proton donor represented by $HXI^5$ or $HX^6$ is a proton donor selected from the group consisting of substituted or unsubstituted benzoic acids, substituted or unsubstituted naphthoic acids, substituted or unsubstituted phenols and substituted or unsubstituted naphthols.

6. The method according to claim 1, wherein the latent catalyst corresponds to that of selection (d), and wherein the proton donor which does not participate in the connection of the recurring units is a proton donor selected from the group consisting of substituted or unsubstituted benzoic acids, substituted or unsubstituted naphthoic acids, substituted or unsubstituted phenols and substituted or unsubstituted naphthols.

7. The method according to claim 1, wherein the latent catalyst corresponds to formula II, and wherein the proton donor represented by $HY^1Z^1Y^2H$ or $HY^3Z^2Y^4H$ is dihydroxybenzene, dihydroxynaphthalene, a bisphenol or a biphenol.

8. The method according to claim 1, wherein the latent catalyst corresponds to formula III, and wherein the proton donor represented by $HY^5Z^3Y^6H$ is dihydroxy-benzene, dihydroxynaphthalene, a bisphenol or a biphenol.

9. The method according to claim 1, wherein the latent catalyst corresponds to that of selection (d), and wherein the proton donor which participates in the connection of the recurring units is dihydroxybenzene, dihydroxynaphthalene, a bisphenol or a biphenol.

* * * * *